US006906359B2

(12) United States Patent
Zampardi et al.

(10) Patent No.: US 6,906,359 B2
(45) Date of Patent: Jun. 14, 2005

(54) BIFET INCLUDING A FET HAVING INCREASED LINEARITY AND MANUFACTURABILITY

(75) Inventors: Peter J. Zampardi, Newbury Park, CA (US); Richard Pierson, Thousand Oaks, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 47 days.

(21) Appl. No.: 10/692,134

(22) Filed: Oct. 22, 2003

(65) Prior Publication Data

US 2005/0087762 A1 Apr. 28, 2005

(51) Int. Cl.[7] .......................................... H01L 31/0328
(52) U.S. Cl. .................. 257/197; 257/192; 257/20; 257/24; 257/272; 257/273; 257/274
(58) Field of Search .............................. 257/12, 20, 24, 257/192, 197, 213, 272, 273, 274, 526, 517, 557

(56) References Cited

PUBLICATIONS

Fresina et al.: "Selective Self–Aligned Emitter Ledge Formation for Heterojunction Bipolar Transistors," IEEE Electron Device Letters, vol. 17, No. 12, Dec., 1996, pp. 555–556.

Fresina et al.: "InGaP/GaAs HBT with Novel Layer Structure for Emitter Ledge Fabrication," IEEE, 0–7803–3393–4, 1996, pp. 207–210.

*Primary Examiner*—Minhloan Tran
*Assistant Examiner*—Tan Tran
(74) *Attorney, Agent, or Firm*—Farjami & Farjami LLP

(57) ABSTRACT

According to one exemplary embodiment, a BiFET situated on a substrate comprises an emitter layer segment situated over the substrate, where the emitter layer segment comprises a semiconductor of a first type. The HBT further comprises a first segment of an etch stop layer, where the first segment of the etch stop layer comprises InGaP. The BiFET further comprises a FET situated over the substrate, where the FET comprises source and drain regions, where a second segment of the etch stop layer is situated under the source and drain regions, and where the second segment of the etch stop layer comprises InGaP. The FET further comprises a semiconductor layer of a second type situated under the second segment of the etch stop layer. The etch stop layer increases linearity of the FET and does not degrade electron current flow in the HBT.

20 Claims, 2 Drawing Sheets

US 6,906,359 B2

BIFET INCLUDING A FET HAVING INCREASED LINEARITY AND MANUFACTURABILITY

BACKGROUND OF THE INVENTION

1. Field of the Invention

The present invention is generally in the field of fabrication of semiconductor devices. More specifically, the invention is in the field of fabrication of transistors.

2. Related Art

By utilizing BiFET technology, bipolar transistors, such as heterojunction bipolar transistors ("HBTs"), and field effect transistors ("FETs") can be integrated on the same semiconductor die to provide devices, such as RF power amplifiers, having increased design flexibility. As a result, a BiFET power amplifier including an HBT and a FET can be advantageously designed to operate at a lower reference voltage than a bipolar transistor power amplifier. Of particular interest to device manufacturers are high power BiFET amplifiers, which can be formed by integrating a FET into a gallium arsenide ("GaAs") HBT process. However, previous attempts to integrate a FET into a GaAs HBT process have resulted in degraded HBT performance and/or reduced FET manufacturability.

For example, in one conventional approach, a FET can be formed using a GaAs emitter cap layer as a FET channel, which is situated between an aluminum gallium arsenide ("AlGaAs") emitter layer and a heavily doped N type GaAs layer. A recess can be formed in the heavily doped N type GaAs layer by utilizing a timed etch process and a gate layer can be formed in the recess. However, as a result of the timed etch process, FET threshold voltage uniformity is difficult to achieve in the above approach, which decreases FET manufacturability.

In an effort to avoid using a timed etch process, an aluminum arsenide ("AlAs") etch stop layer has been utilized over the channel layer in a FET formation process. However, when an AlAs etch stop layer is utilized to form a BiFET including a FET and a GaAs HBT, the AlAs etch stop layer degrades HBT performance by undesirably blocking electron flow in the HBT. Furthermore, since oxidation of the AlAs etch stop layer can cause portions of the device situated over the AlAs etch stop layer to break off, the AlAs etch stop layer reduces long term device reliability.

Thus, there is a need in the art for a BiFET that achieves increased FET manufacturability without causing degradation in HBT performance.

SUMMARY OF THE INVENTION

The present invention is directed to BiFET including a FET having increased linearity and manufacturability. The present invention addresses and resolves the need in the art for a BiFET that achieves increased FET manufacturability without causing degradation in HBT performance.

According to one exemplary embodiment, a BiFET situated on a substrate comprises an emitter layer segment situated over the substrate, where the emitter layer segment comprises a semiconductor of a first type. The semiconductor of the first type can be a lightly doped InGaP. The HBT further comprises a first segment of an etch stop layer, where the first segment of the etch stop layer comprises InGaP. The BiFET further comprises a FET situated over the substrate, where the FET comprises source and drain regions, where a second segment of the etch stop layer is situated under the source and drain regions, and where the second segment of the etch stop layer comprises InGaP. The FET can be, for example, a depletion mode FET or an enhancement mode FET. The etch stop layer may have a thickness between approximately 100.0 Angstroms and approximately 150.0 Angstroms, for example. In the BiFET, the etch stop layer increases linearity of the FET and does not degrade electron current flow in the HBT.

According to this exemplary embodiment, the FET further comprises a semiconductor layer of a second type situated under the second segment of the etch stop layer in the FET. The semiconductor layer of the second type can comprise GaAs. The BiFET further comprises a metal gate contact situated on the second segment of the etch stop layer in the FET. Other features and advantages of the present invention will become more readily apparent to those of ordinary skill in the art after reviewing the following detailed description and accompanying drawings.

DETAILED DESCRIPTION OF THE INVENTION

The present invention is directed to BiFET including a FET having increased linearity and manufacturability. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. Certain details and features have been left out of FIG. 1, which are apparent to a person of ordinary skill in the art. Although structure 100 illustrates an exemplary BiFET comprising an NPN HBT and an NFET, which are situated over a substrate in a semiconductor die, the present invention may also apply to a BiFET comprising a PNP HBT and a PFET.

Figure 1:
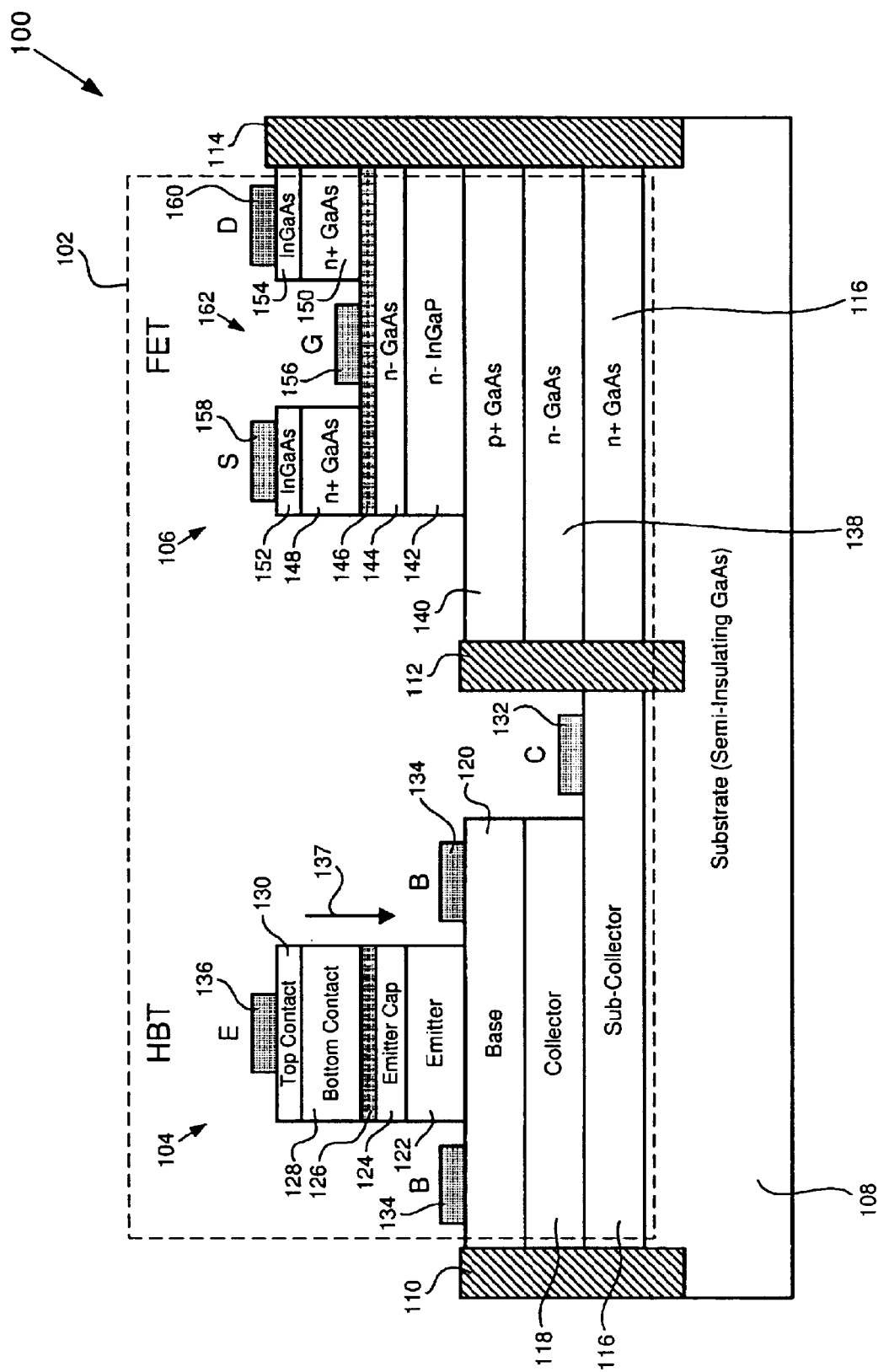
FIG. 1 illustrates a cross sectional view of an exemplary BiFET including an HBT and a FET situated over a substrate in accordance with one embodiment of the present invention.

FIG. 1 shows a cross-sectional view of an exemplary structure including an exemplary BiFET in accordance with one embodiment of the present invention. Certain details and features have been left out of FIG. 1, which are apparent to a person of ordinary skill in the art. As shown in FIG. 1, structure 100 includes BiFET 102, isolation regions 110, 112, and 114, and substrate 108, which can be a semi-insulating GaAs substrate. BiFET 102 includes HBT 104, which is situated over substrate 108 between isolation regions 110 and 112, and FET 106, which is situated over substrate 108 between isolation regions 112 and 114. Isolation regions 110, 112, and 114 provide electrical isolation from other devices on substrate 108 and can be formed in a manner known in the art.

Also shown in FIG. 1, HBT 104 includes sub-collector layer 116, collector layer segment 118, base layer segment 120, emitter layer segment 122, emitter cap layer segment 124, etch stop layer segment 126, bottom contact layer segment 128, top contact layer segment 130, collector contact 132, base contacts 134, and emitter contact 136. Further shown in FIG. 1, FET 106 includes lightly doped N type InGaP segment 142, lightly doped N type GaAs segment 144, etch stop layer segment 146, typically comprising lightly doped N type InGaP according to an embodiment of the present invention, source and drain regions, which include regions 148 and 150, typically comprising heavily doped N type GaAs, contact layer segments, typically comprising InGaAs, gate contact 156, source contact 158, and drain contact 160. In the present embodiment, HBT 104 can be an NPN HBT and FET 106 can be an NFET. In one embodiment, HBT 104 can be a PNP HBT and FET 106 can be a PFET. In the present embodiment, FET 106 can be a depletion mode FET. In one embodiment, FET 106 can be an enhancement mode FET.

Also shown in FIG. 1, sub-collector layer 116 is situated on substrate 108 and can comprise heavily doped N type GaAs. Sub-collector layer 116 can be formed by using a metal organic chemical vapor deposition ("MOCVD") process or other processes. Further shown in FIG. 1, collector layer segment 118 and collector contact 132 are situated on subcollector layer 116. Collector layer segment 118 can comprise lightly doped N type GaAs and can be formed by using a MOCVD process or other processes. Collector contact 132 can comprise an appropriate metal or combination of metals, which can be deposited and patterned over subcollector layer 116. Also shown in FIG. 1, base layer segment 120 is situated on collector layer segment 118 and can comprise heavily doped P type GaAs. Base layer segment 120 can be formed by using a MOCVD process or other processes.

Further shown in FIG. 1, emitter layer segment 122 and base contacts 134 are situated on base layer segment 120. Emitter layer segment 122 can comprise lightly doped N type indium gallium phosphide ("InGaP") and can be formed on base layer segment 120 by using a MOCVD process or other processes. Base contacts 134 can comprise an appropriate metal or combination of metals, which can be deposited and patterned over base layer segment 120. Also shown in FIG. 1, emitter cap layer segment 124 is situated on emitter layer segment 122 and can comprise lightly doped N type GaAs. Emitter cap layer segment 124 can be formed by using a MOCVD process or other processes.

Further shown in FIG. 1, etch stop layer segment 126 is situated on emitter cap layer segment 124 and can comprise lightly doped N type InGaP. Etch stop layer segment 126 can be formed by using a MOCVD process or other processes. Also shown in FIG. 1, bottom contact layer segment 128 is situated on etch stop layer segment 126 and comprise heavily doped N type GaAs. Bottom contact layer segment 128 can be formed by using an MOCVD process or other processes.

Further shown in FIG. 1, top contact layer segment 130 is situated on bottom contact layer segment 128 and can comprise heavily doped N type indium gallium arsenide ("InGaAs"). Top contact layer segment 130 can be formed by using a MOCVD process or other processes. Also shown in FIG. 1, emitter contact 136 is situated on top contact layer segment 130 and can comprise an appropriate metal or combination of metals, which can be deposited and patterned over top contact layer 130.

During operation of HBT 104, electron current flow from emitter contact 136, through top contact layer segment 130, bottom contact layer segment 128, etch stop layer segment 126, emitter cap layer segment 124, emitter layer segment 122, and into base layer segment 120 is indicated by arrow 137. In the present invention, since InGaP has a very low conduction band offset, etch stop layer segment 122 provides substantially no barrier to electron flow in HBT 104. As a result, the present invention's etch stop layer, i.e. etch stop layer segment 122, causes substantially no performance degradation of HBT 104. In contrast, a conventional etch stop layer comprising AlAs blocks electrons from flowing through the HBT by forming a thermionic emission barrier, which causes a significantly increased variation of HBT characteristics over temperature. As a result, the conventional AlAs etch stop layer causes significant HBT performance degradation. Additionally, oxidation of AlAs can cause layers situated above a conventional AlAs etch stop layer to separate from the AlAs etch stop layer and, thereby, cause device failure. Thus, since InGaP is non-oxidizing, the present invention's InGaP etch stop layer increases HBT reliability compared to a conventional AlAs etch stop layer.

Further shown in FIG. 1, lightly doped N type GaAs segment 138 is situated on heavily doped N type GaAs layer 116 and is substantially similar in composition and formation to collector layer segment 118 discussed above. Also shown in FIG. 1, heavily doped P type GaAs segment 140 is situated on lightly doped N type GaAs segment 138 and is substantially similar in composition and formation to base layer segment 120 discussed above. Further shown in FIG. 1, lightly doped N type InGaP segment 142 is situated on heavily doped P type GaAs segment 140 and is substantially similar in composition and formation to emitter layer segment 122 discussed above.

Also shown in FIG. 1, lightly doped N type GaAs segment 144 is situated on lightly doped N type InGaP segment 142 and is substantially similar in composition and formation to emitter cap layer segment 124 discussed above. Lightly doped N type GaAs segment 144 forms a channel for FET 106. Further shown in FIG. 1, etch stop layer segment 146 is situated on lightly doped N type GaAs segment 144 and can comprise lightly doped N type InGaP. Etch stop layer segment 146 can be formed on lightly doped N type GaAs segment 144 by using a MOCVD process or other appropriate processes. In the present embodiment, etch stop layer segment 146 can have a thickness between approximately 100.0 Angstroms and approximately 150.0 Angstroms. In one embodiment, FET 106 can be an enhancement mode FET and etch stop layer segment 146 can have a thickness less than 100.0 Angstroms.

Also shown in FIG. 1, source region 148 and drain region 150 are situated on etch stop layer segment 146 and can comprise heavily doped N type GaAs. Source and drain regions 148 and 150 can be formed by using a MOCVD process or other processes. Further shown in FIG. 1, contact layer segments 152 and 154 are situated on source and drain regions 148 and 150, respectively, and can comprise heavily doped N type InGaAs. Contact layer segments 152 and 154 can be formed by using a MOCVD process or other processes.

Further shown in FIG. 1, source contact 158 and drain contact 160 are situated on top contact layer segments 152 and 154, respectively. Source and drain contacts 158 and 160 can comprise platinum gold ("PtAu") or other appropriate metals and can be formed in a manner known in the art. Also shown in FIG. 1, gate contact 156 is situated on etch stop layer segment 146 in gap 162, which is formed between source and drain regions 148 and 150, and can comprise an appropriate metal or combination of metals. Gap 162 can be formed by utilizing an appropriate etch chemistry to selectively etch through a layer of InGaAs and a layer of GaAs and stop on etch stop layer segment 146. After gap 162 has been formed, gate contact 156 can be formed on etch stop layer segment 146 in a manner known in the art. In one embodiment, FET 106 can be an enhancement mode FET and gate contact 156 can be formed directly on lightly doped N type GaAs segment 144. In that embodiment, an appropriate etch chemistry can be utilized to selectively etch through etch stop layer segment 146 and stop on lightly doped N type GaAs segment 144.

Thus, by utilizing etch stop layer segment 146, the present invention can utilize a selective etch process to accurately control the depth of gap 162 and thereby form gate contact 156 precisely on the top surface of etch stop layer segment 146. In other words, since etch stop layer segment 146 is not etched in the selective etch process, the depth of gap 162 and, consequently, the location of gate contact 156 can be accurately controlled. As a result, the present invention achieves accurate control of the threshold voltage of FET 106, which enables the present invention to achieve a uniform threshold voltage. By way of example, for a depletion mode FET, the threshold voltage is between approximately −0.5 volts and −0.7 volts and for an enhancement mode FET, the threshold voltage is approximately 0.5 volts. As a result, by utilizing etch stop layer segment 146 to accurately control the location of gate contact 156, the present invention achieves a FET that can be more accurately reproduced across a wafer, which increases manufacturing yield. Thus, by utilizing etch stop layer segment 146, the present invention advantageously increases FET manufacturability. Additionally, by forming a gate contact on an InGaP etch stop layer, the present invention advantageously achieves a FET having increased linearity, which will be discussed further in relation to FIG. 2.

Figure 2:
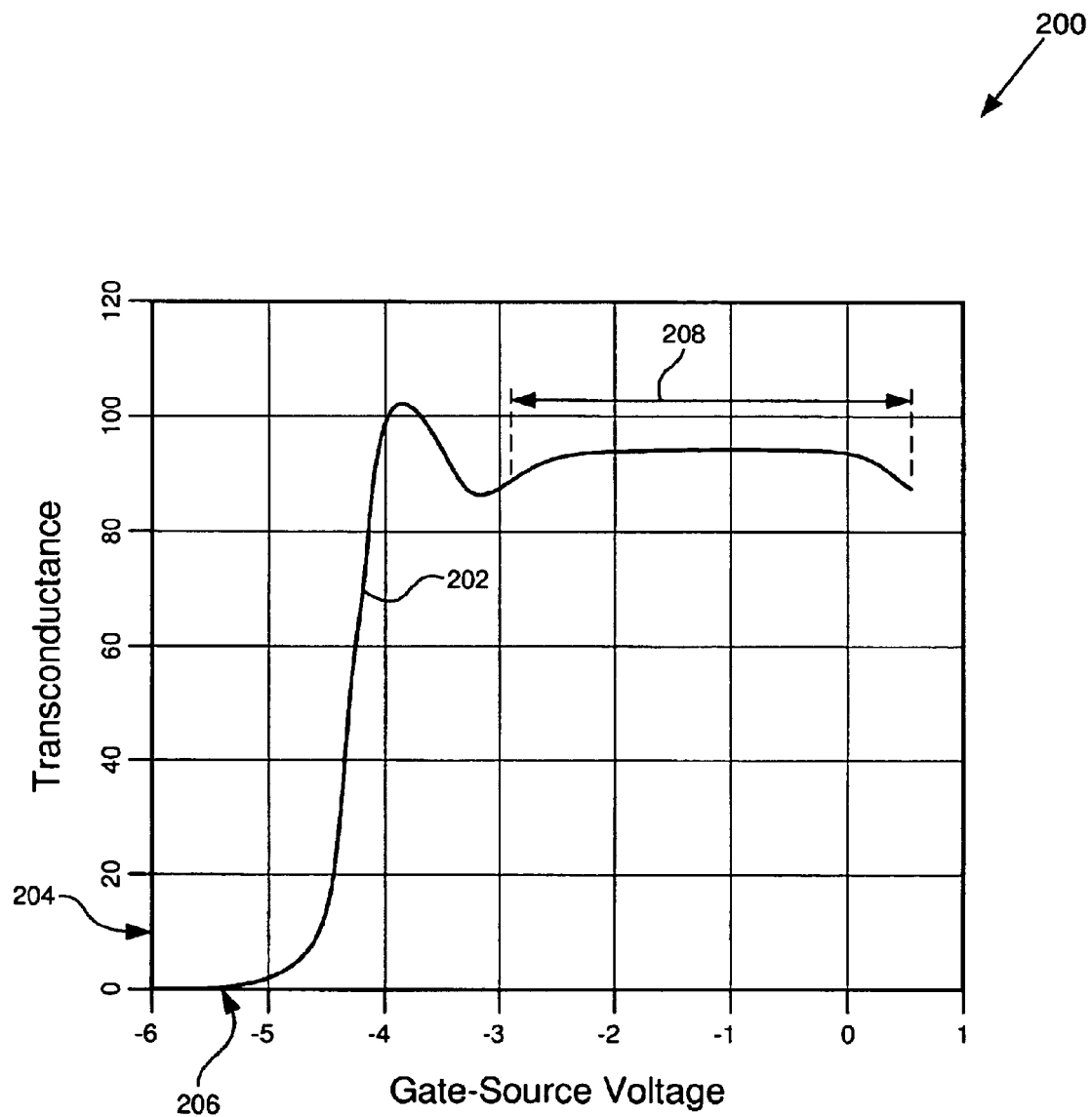
FIG. 2 is a graph illustrating an exemplary transconductance curve for an exemplary FET in accordance with one embodiment of the present invention.

Graph 200 in FIG. 2 shows an exemplary transconductance curve of an exemplary HBT in accordance with one embodiment of the present invention. Graph 200 shows transconductance curve 202, which shows the change in transconductance of FET 106 in FIG. 1 caused by a change in gate to source voltage ("Vgs"). Graph 200 includes transconductance axis 204 plotted against Vgs axis 206.

As shown in graph 200, region 208 of transconductance curve 202 is relatively unchanged between approximately −4.0 volts Vgs and approximately 0.5 volts Vgs, which indicates linearity of FET 106; thus region 208 is also referred to as "flat region 208" in the present application. Flat region 208 of transconductance curve 202 occurs as a result of gate contact 156 comprising a wide band gap material, i.e. a metal, and being situated on an InGaP etch stop layer segment 146, instead of gate contact 156 directly interfacing GaAs channel 144. Thus, by utilizing an InGaP etch stop layer situated under a metal gate contact, the present invention advantageously achieves increased FET linearity, i.e. transconductance of FET 106 is constant over a larger range of gate to source voltages. Linearity is an important aspect of a FET characteristics since, for example, in an amplifier utilizing the FET, it is important that the gain of the amplifier remain predictable and unchanged despite variations in the gate to source voltage of the FET.

As discussed above, by utilizing an InGaP etch stop layer in a BiFET, the present invention advantageously achieves a BiFET including a FET having increased linearity. Also, the present invention's InGaP etch stop layer does not cause degradation of HBT performance. Additionally, since InGaP is non-oxidizing, the present invention's InGaP etch stop layer increases BiFET reliability compared to a conventional AlAs etch stop layer, which is subject to oxidation. Moreover, by utilizing an InGaP etch stop layer to accurately control the location of the gate contact, the present invention provides a FET that can be more accurately reproduced across the wafer. Thus, because of non-degradation of HBT performance, non-oxidation, and accurately controlled gate contact location, the present invention advantageously achieves increased manufacturability.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, BiFET including a FET having increased linearity and manufacturability has been described.

What is claimed is:

1. A BiFET situated on a substrate, said BiFET comprising:
   an HBT situated over said substrate, said HBT comprising:
      an emitter layer segment situated over said substrate, said emitter layer segment comprising a semiconductor of a first type;
      a first segment of an etch stop layer situated over said emitter layer segment, said first segment of said etch stop layer comprising InGaP;
   a FET situated over said substrate, said FET comprising:
      source and drain regions, a second segment of said etch stop layer situated under said source and drain regions, said second segment of said etch stop layer comprising InGaP;
      a semiconductor layer of a second type situated under said second segment of said etch stop layer in said FET;
   wherein said etch stop layer increases a linearity of said FET and wherein said etch stop layer does not degrade electron current flow in said HBT.

2. The BiFET of claim 1 further comprising a metal gate contact situated on said second segment of said etch stop layer in said FET.

3. The BiFET of claim 1 further comprising source and drain contacts situated on said source and drain regions, respectively, said source and drain contacts comprising InGaAs.

4. The BiFET of claim 1 wherein said etch stop layer segment has a thickness between approximately 100.0 Angstroms and approximately 150.0 Angstroms.

5. The BiFET of claim 1 wherein said semiconductor of said first type comprises InGaP.

6. The BiFET of claim 1 wherein said semiconductor layer of said second type comprises GaAs.

7. The BiFET of claim 1 wherein said FET is a depletion mode FET.

8. The BiFET of claim 1 wherein said FET is an enhancement mode FET.

9. A BiFET situated on a substrate, said BiFET comprising:

an HBT situated over said substrate, said HBT comprising:
   an emitter layer segment situated over said substrate, said emitter layer segment comprising a semiconductor of a first type;
   a first segment of an etch stop layer situated over said emitter layer segment, said first segment of said etch stop layer comprising InGaP;
a FET situated over said substrate, said FET comprising:
   source and drain regions, a second segment of said etch stop layer situated under said source and drain regions, said second segment of said etch stop layer comprising InGaP;
   a semiconductor layer of a second type situated under said second segment of said etch stop layer in said FET;
   source and drain contacts situated on said source and drain regions, respectively, said source and drain contacts comprising a semiconductor of a third type;
wherein said etch stop layer increases a linearity of said FET and wherein said etch stop layer does not degrade electron current flow in said HBT.

10. The BiFET of claim 9 further comprising a metal gate contact situated on said second segment of said etch stop layer in said FET.

11. The BiFET of claim 9 wherein said etch stop layer segment has a thickness between approximately 100.0 Angstroms and approximately 150.0 Angstroms.

12. The BiFET of claim 9 wherein said semiconductor of said first type comprises InGaP.

13. The BiFET of claim 9 wherein said semiconductor of said third type comprises InGaAs.

14. The BiFET of claim 9 wherein said FET in an enhancement mode FET.

15. The BiFET of claim 9 wherein said FET is a depletion mode FET.

16. A BiFET situated on a substrate, said BiFET comprising:
   an HBT situated over said substrate, said HBT comprising:
     an emitter layer segment situated over said substrate, said emitter layer segment comprising a semiconductor of a first type;
     a first segment of an etch stop layer situated over said emitter layer segment, said first segment of said etch stop layer comprising InGaP;
   a FET situated over said substrate, said FET comprising:
     source and drain regions, a second segment of said etch stop layer situated under said source and drain regions, said second segment of said etch stop layer comprising InGaP;
     source and drain contacts situated on said source and drain regions, respectively;
     a metal gate contact situated on said second segment of said etch stop layer;
     a semiconductor layer of a second type situated under said second segment of said etch stop layer in said FET, said semiconductor layer of said second type forming a channel of said FET;
wherein said etch stop layer increases a linearity of said FET and wherein said etch stop layer does not degrade electron current flow in said HBT.

17. The BiFET of claim 16 wherein said source and drain contacts comprise InGaAs.

18. The BiFET of claim 16 wherein said semiconductor of said first type comprises InGaP.

19. The BiFET of claim 16 wherein said etch stop layer segment has a thickness between approximately 100.0 Angstroms and approximately 150.0 Angstroms.

20. The BiFET of claim 16 wherein said semiconductor layer of said second type comprises GaAs.

* * * * *